United States Patent
Vaartstra

[11] Patent Number: 6,063,705
[45] Date of Patent: *May 16, 2000

[54] PRECURSOR CHEMISTRIES FOR CHEMICAL VAPOR DEPOSITION OF RUTHENIUM AND RUTHENIUM OXIDE

[75] Inventor: Brian A. Vaartstra, Nampa, Id.

[73] Assignee: Micron Technology, Inc., Boise, Id.

[*] Notice: This patent is subject to a terminal disclaimer.

[21] Appl. No.: 09/141,236

[22] Filed: Aug. 27, 1998

[51] Int. Cl.$^7$ .............................. C23C 16/16; C23C 16/18
[52] U.S. Cl. ..................... 438/681; 438/686; 438/758; 438/778; 427/576; 427/584; 427/252; 427/253; 427/255.31
[58] Field of Search .............................. 427/99, 124, 576, 427/584, 585, 250, 252, 253, 255.31; 438/681, 686, 758, 778

[56] References Cited

U.S. PATENT DOCUMENTS

| | | | |
|---|---|---|---|
| 4,250,210 | 2/1981 | Crosby et al. | 427/252 |
| 4,982,309 | 1/1991 | Shepherd | 361/321 |
| 5,130,172 | 7/1992 | Hicks et al. | 427/252 |
| 5,314,727 | 5/1994 | McCormick et al. | 427/584 |
| 5,352,488 | 10/1994 | Spencer et al. | 427/250 |
| 5,372,849 | 12/1994 | McCormick et al. | 427/253 |
| 5,618,761 | 4/1997 | Eguchi et al. | 438/785 |
| 5,637,533 | 6/1997 | Choi | 438/683 |

OTHER PUBLICATIONS

Green et al., J. Electrochem. Soc., vol. 132, No. 11, pp. 2677–2685, Nov. 1985.

Cowles et al., Chemical Communications, p. 392 (no month), 1969.

Green et al., "Chemical Vapor Deposition of Ruthenium and Ruthenium Dioxide Films", *J. Electrochem. Soc.,* vol. 132, No. 11, pp. 2677–2685, Nov. 1985.

Liao et al., "Characterization of $RuO_2$ thin films deposited on Si by metal-organic chemical vapor deposition", *Thin Solid Films,* 287, pp. 74–79, 1996, (No Month).

*Primary Examiner*—Timothy Meeks
*Attorney, Agent, or Firm*—Trask, Britt & Rossa

[57] ABSTRACT

A method is provided for forming a film of ruthenium or ruthenium oxide on the surface of a substrate by employing the techniques of chemical vapor deposition to decompose precursors of ruthenium having the formula: $L_yRuX_z$ where L is a neutral or monoanionic ligand selected from the group consisting essentially of linear hydrocarbyls, branched hydrocarbyls, cyclic hydrocarbyls, cyclic alkenes, dienes, cyclic dienes, trienes, cyclic trienes, bicyclic alkenes, bicyclic dienes, bicyclic trienes, tricyclic alkenes, tricyclic dienes, tricyclic trienes; fluorinated derivatives thereof; derivatives thereof additionally containing heteroatoms such as a halide, Si, S, Se, P, As, N or O; and combinations thereof; where X is a pi-bonding ligand selected from the group consisting of CO, NO, CN, CS, nitriles, isonitriles, trialkylphosphines, trialkylphosphites, trialkylamines, and isocyanide, and where subscripts y and z have a value of from one (1) to three (3); or $L_1Ru(CO)_4$ where L is a neutral or monoanionic ligand selected from the group including linear hydrocarbyls, branched hydrocarbyls, cyclic hydrocarbyls, cyclic alkenes, dienes, cyclic dienes, trienes, cyclic trienes, bicyclic dienes, and bicyclic trienes.

71 Claims, 1 Drawing Sheet

PRECURSOR CHEMISTRIES FOR CHEMICAL VAPOR DEPOSITION OF RUTHENIUM AND RUTHENIUM OXIDE

BACKGROUND OF THE INVENTION

1. Field of the Invention

The present invention relates to chemical vapor deposition of films of ruthenium. More particularly, the invention relates to chemical vapor deposition of ruthenium and ruthenium oxide, and to new compositions useful in forming said depositions.

2. State of the Art

Use of chemical vapor deposition ("CVD") methods for depositing a thin film of material on a substrate, such as a silicon wafer or other exposed material surface on a wafer or other semiconductor base, are widely known and used in the semiconductor fabrication industry. In CVD, a precursor, such as a heat decomposable volatile compound, is contacted with a substrate which has been heated to a temperature above the decomposition temperature of the precursor. In this fashion, a coating, which typically consists of a metal, metal mixture or alloy, ceramic, metal compound, or a mixture thereof, depending on the choice of precursors and reaction conditions, is formed on the substrate.

Use of CVD as a thin film formation method includes numerous desirable characteristics, such as the ability to readily control the composition of the thin film and the ability to form a thin film without contamination of, or damage to, the substrate. CVD may also be used to deposit films of metals into vias, trenches, and other recesses or stepped structures. In situations where conformal thin-film deposition is required, CVD techniques are a preferred method of deposition, since evaporation and sputtering techniques cannot be used to form a conformal thin-film deposition layer.

While CVD techniques have been described in the literature with reference to many metals and metalloids, commercial use of CVD has been predominantly confined to deposition of a few metals and metal compounds, such as tungsten, silicon, titanium nitride, silicon oxide, iron, and aluminum. CVD of other metals has been limited due to a variety of reasons, including formation of poor film quality, requirement of high processing temperatures, lack of suitable precursor compounds, and instability of the precursors used in the deposition systems. The availability of suitable volatile and heat-decomposable precursor compounds appears to be the greatest limiting factor in the application of CVD to the production of metal-containing films.

In integrated circuit processing, selected precursor compounds have been used to form conducting films that can maintain their integrity at elevated temperatures. Ruthenium and ruthenium dioxide ($RuO_2$) are particularly well-suited as conducting films for such applications since they have good electrical conductivities, exhibit high stability over a wide temperature range and exhibit good adherence to silicon, silicon dioxide, and to ceramic oxides. Films of ruthenium and ruthenium oxide deposited by CVD have been proposed to be useful for contact metallizations, diffusion barriers, and gate metallizations. M. L. Green et al., *J. Electrochem. Soc.*, 132, 2677 (1985).

A number of CVD methods, utilizing a variety of ruthenium precursors, have been disclosed or used in the formation of ruthenium films with varying degrees of success. One such method involves a chemical spray deposition process wherein tris(acetylacetonate)ruthenium in butanol is converted into an aerosol spray using a hydrogen/nitrogen mixture as the carrier gas. Triruthenium dodecacarbonyl, ruthenocene, and tris(acetylacetonate)ruthenium have also been compared as CVD precursors in the formation of ruthenium and $RuO_2$ by M. Green et al., in *J. Electrochem. Soc.*, 132, 2677 (1985). However, because none of the aforementioned precursors are very volatile, high deposition rates using these precursors are difficult to obtain.

U.S. Pat. No. 4,250,210, issued Feb. 10, 1981 to Crosby et al., discloses the use of ruthenium 1,3 dione compounds, such as tris(acetylacetonate)ruthenium and its fluorinated derivatives, in the CVD of ruthenium films. Although the fluorinated ligands are said to provide greater volatility and good deposition rates when heated to over 200° C., difficulties in attaining uniform coatings are noted due to the poor stability of the precursors. The low stability of the precursors yields inferior coatings that are especially pronounced when aged samples of the precursors are used. Furthermore, organic byproducts (e.g., oligomers of the acetylacetonate ligands) with very low vapor pressures are formed and collected in the reactor during the volatilization process, which can create a serious contamination problem in production-scale applications of the tris(acetylacetonate) ruthenium precursors.

Also disclosed in the Crosby patent is the use of ruthenium carbonyl chloride and penta(trifluorophosphine) ruthenium as precursors for ruthenium CVD. Use of these precursor compounds, however, is undesirable because the obtainable rates of deposition of ruthenium are very low. Additionally, ruthenium carbonyl chloride corrodes certain substrates, making a consistent product preparation difficult or impossible. This lack of consistency in the product can show up as a substantially nonvolatile form of the carbonyl chloride, which decomposes before it can volatilize.

U.S. Pat. No. 5,372,849 issued Dec. 13, 1994 to McCormick et al. discloses the use of organometallic precursors of iron, ruthenium, and osmium. Many of the disclosed ruthenium precursors are high volatility compounds that allow for high deposition rates and a reduction in carbon contamination in a non-reduced atmosphere. However, many of the disclosed ruthenium precursors are large or complex molecules that presumably exist in a predominantly solid state and which, due to their solid state, require sublimation for use in CVD of films of ruthenium.

Thus, in view of the described shortcomings of the available precursors, a continuing need exists for improved ruthenium precursors useful for the CVD of films of ruthenium. More specifically, a need exists for high-volatility ruthenium precursors that are easy to prepare and to use in low-temperature CVD processes and which are capable of depositing high quality, continuous films of ruthenium having good surface morphology.

SUMMARY OF THE INVENTION

The present invention provides a method for applying a film of ruthenium or ruthenium oxide to the surface of a substrate by employing the techniques of chemical vapor deposition (CVD) to decompose a neutral precursor of ruthenium having the following formula:

$$L_y RuX_z$$

where L is a neutral or monoanionic ligand selected from the group of ligands including linear, branched, or cyclic hydrocarbyls (e.g., allenyl, aryl, alkyl, dienyl, trienyl), cyclic alkenes, dienes, cyclic dienes, trienes, cyclic trienes, bicyclic alkenes, bicyclic dienes, bicyclic trienes, tricyclic alkenes, tricyclic dienes, tricyclic trienes; fluorinated derivatives thereof; derivatives thereof additionally containing heteroatoms such as a halide, Si, S, Se, P, As, N or O; and combinations thereof. X is a pi-bonding ligand selected from the group consisting of CO, NO, CN, CS, nitriles, isonitriles, trialkylphosphines, trialkylphosphites, trialkylamines, and isocyanide. Subscripts y and z can each have a value of from one (1) to three (3).

A variation under the method of the invention provides for CVD of the ruthenium or ruthenium oxide film by decomposing Ru precursors chosen from the general class of compounds having the following formula:

$$L_1Ru(CO)_4$$

where L is a neutral or monoanionic ligand selected from the group including linear, branched, or cyclic hydrocarbyls (e.g., allenyl, aryl, alkyl, dienyl, trienyl), cyclic alkenes, dienes, cyclic dienes, trienes, cyclic trienes, bicyclic dienes, and bicyclic trienes.

The method of the present invention provides an improved CVD technique wherein continuous Ru films of high quality and good surface morphology can be deposited at low temperatures by utilizing the aforementioned compounds as precursors in the CVD process. In the absence of an oxygen source, the deposited films consist essentially of Ru in that they contain only minor amounts of residual elements derived from the X group, thus forming essentially pure films of Ru. The aforementioned precursor compounds may be used as neat liquids, in mixtures, or in solvents for delivery by liquid injection\flash evaporation techniques.

Alternatively, the present invention provides a CVD method where the precursor compounds either contain significant amounts of oxygen or are used in combination with reactive carrier gases (e.g., oxidizers such as $O_2$ or $N_2O$) to deposit films of $RuO_2$. Alternatively, Ru metal deposited on a polysilicon electrode can be subjected to post-deposition rapid thermal oxidation (RTO) to cause silicidation of the bottom layer and oxidation of the top layer of the Ru film. This layer configuration can also be formed by depositing Ru metal first (to be later silicided) and then forming an oxide thereon either in situ, through the addition of an oxidizer, or by post deposition anneal.

Alternating layers of essentially pure Ru and of $RuO_2$ can also be deposited on a single substrate by selecting and alternating the precursors or reactive carrier gases present in the environment during the CVD process(es).

DETAILED DESCRIPTION OF THE PREFERRED EMBODIMENTS

A. Ruthenium Precursors

Figure 1:
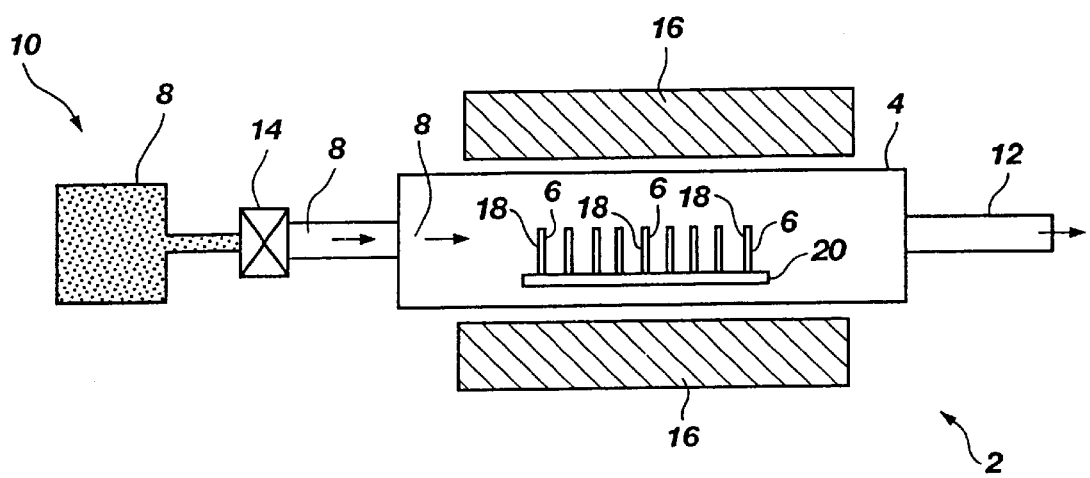
FIG. 1 is a schematic representation of a chemical vapor deposition apparatus.

In the present invention, neutral precursors of ruthenium are chosen from a general class of compounds of formula (1):

$$L_yRuX_z \quad (1)$$

where L is a neutral or monoanionic ligand selected from the group of ligands including linear, branched, or cyclic hydrocarbyls (e.g., allenyl, aryl, alkyl, dienyl, trienyl), cyclic alkenes, dienes, cyclic dienes, trienes, cyclic trienes, bicyclic alkenes, bicyclic dienes, bicyclic trienes, trycyclic alkenes, tricyclic dienes, trycyclic trienes; fluorinated derivatives thereof; derivatives thereof additionally containing heteroatoms such as a halide, Si, S, Se, P, As, N or O; and combinations thereof. Preferably, the neutral or monoanionic ligand includes cyclic hydrocarbyls having about 2 to about 8 carbon atoms. X is a pi-bonding ligand selected from the group including CO, NO, CN, CS, nitriles, isonitriles, trialkylphosphines, trialkylphosphites, trialkylamines, and isocyanide. Subscripts y and z can each have a value of from one (1) to three (3).

In a preferred method of the invention, Ru precursors used with the instant method are chosen from the general class of compounds of formula (2):

$$L_yRuX_3 \quad (2)$$

where L is a neutral or monoanionic ligand selected from the group of ligands described in conjunction with formula (1) and X is a pi-bonding ligand selected from the group of ligands identified in conjunction with formula (1). Subscript y can have a value of from one (1) to three (3). Preferred precursors of formula (2) which are useful for the deposition of ruthenium are cycloheptadienetricarbonyl ruthenium (($C_7H_{10}$)Ru(CO)$_3$) and cyclohexadienetricarbonyl ruthenium (($C_6H_8$)Ru(CO)$_3$). These precursors can be successfully used to deposit analytically pure ruthenium films on silicon wafers at temperatures between about 200° and 300° C.

In yet another method of the invention, Ru precursors used with the instant method are chosen from the general class of compounds of formula (3):

$$L_yRu(CO)_4 \quad (3)$$

where L is a neutral or monoanionic ligand selected from the group including linear, branched, or cyclic hydrocarbyls (e.g., allenyl, aryl, alkyl, dienyl, trienyl), cyclic alkenes, dienes, cyclic dienes, trienes, cyclic trienes, bicyclic dienes, and bicyclic trienes. Subscript y can have a value of from one (1) to three (3).

Broadly, complexes of formulas (1) and (2) may be prepared by thermal or photolytic reaction, as shown in equation (4):

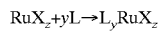

$$RuX_z + yL \rightarrow L_yRuX_z \quad (4)$$

where L is a neutral or monoionic ligand selected from the group of ligands described in conjunction with formula (1) and X is a pi-bonding ligand selected from the group of ligands identified in conjunction with formula (1). For example, ($C_6H_8$)Ru(CO)$_3$ can be prepared by reacting triruthenium dodecacarbonyl (Ru$_3$(CO)$_{12}$) with cyclohexadiene ($C_6H_8$). Likewise, ($C_7H_{10}$)Ru(CO)$_3$ can be prepared by reacting triruthenium dodecacarbonyl (Ru$_3$(CO)$_{12}$) with cycloheptadiene ($C_7H_{10}$).

Complexes of formula (3) may be prepared by thermal or photolytic reaction, as shown in equation (5):

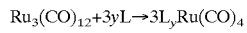

$$Ru_3(CO)_{12} + 3yL \rightarrow 3L_yRu(CO)_4 \quad (5)$$

where L is a neutral or monoanionic ligand selected from the group including linear, branched, or cyclic hydrocarbyls (e.g., allenyl, aryl, alkyl, dienyl, trienyl), cyclic alkenes, dienes, cyclic dienes, trienes, cyclic trienes, bicyclic dienes, and bicyclic trienes. Subscript y can have a value of from one (1) to three (3).

The precursor compounds of formulas (1) through (3) may vary with respect to their air and thermal stability, depending on the ligands (i.e., the L and X groups) incorporated into the complexes. It is understood that the air stability of the compounds of formulas (1) through (3) is sufficiently high to allow the compounds to be handled in the absence of inert atmospheres such as argon and nitrogen, which, in turn, decreases the operating costs for performing the CVD process. Furthermore, the ability to vary the L group ligands of formulas (1) through (3) and the X group ligands of formulas (1) and (2) provides an excellent degree of control over both volatility and deposition conditions for the precursors of the present invention. Thus, the choice of L and R group ligands for the respective aforementioned formulas can have a significant effect on the electron density of these precursors, which affects the thermal stability of the precursors and determines the deposition conditions for each given precursor compound. This ability to control both the deposition conditions and the deposition rate with one variable (L or X) permits customization of the precursor compound design and the associated CVD process.

Illustrative examples of precursor compounds of formula (1) include cyclopentadienetricarbonyl ruthenium, cyclohexadienetricarbonyl ruthenium, cycloheptadienetricarbonyl ruthenium, cycloheptatrienyltricarbonyl ruthenium, norbornadiene tricarbonyl ruthenium, cylcopentadienyltricarbonyl ruthenium, and allyltetracarbonyl ruthenium.

Illustrative examples of precursor compounds of formula (3) include cyclohexadienetetracarbonyl ruthenium, cyclopentadienyltetracarbonyl ruthenium, and allyltetracarbonyl ruthenium.

B. The CVD Process

The invention broadly relates to use of CVD to deposit high-quality films of Ru at low temperatures on the surface of a substrate. The invention can be carried out through any number of known CVD processes, which may be modified by altering such variables as, for example, the heating method, gas pressure, and/or chemical reaction. Conventional CVD methods suitable for use with the Ru precursors of the present invention include cold-wall type CVD, wherein only a deposition substrate is heated through any number of methods such as induction heating or use of hot stages. Alternatively, hot-wall type CVD, in which an entire reaction chamber is heated, can be used.

The CVD processes can also vary with respect to pressure requirements and may include atmospheric CVD, in which the reaction occurs at a pressure of about one atmosphere, or low-pressure CVD, in which reaction occurs at pressures between about $10^{-1}$ and about 100 torr.

Various other conventional CVD methods may be utilized to react the Ru precursors. For example, plasma- or photo-assisted CVD, wherein the energy from a plasma or a light source, respectively, can be used to activate the precursor to allow depositions of Ru at reduced substrate temperatures. Alternatively, ion-beam or electron-beam assisted CVD, in which the energy from an ion or electron beam is directed toward the substrate to provide the energy for decomposition of the Ru precursor. Yet another alternative includes a laser-assisted CVD process, wherein laser light is used to heat the substrate and to effect photolytic reactions in the Ru precursor.

It is understood that the CVD process can be carried out in any type of apparatus in which the substrate and/or the Ru precursor is heated. Suitable CVD apparatus designs include, but are not limited to, hot wall reactors, cold wall reactors, plasma-assisted reactors, radiation beam assisted reactors, and the like. One such suitable CVD apparatus design, in the form of a horizontal tube hot-wall CVD reactor, is schematically depicted in FIG. 1.

As shown in FIG. 1, a typical CVD process begins with the placement of substrate 6, on which deposition is to occur, within reaction chamber 4 of reactor 2. One or more units of substrate 6 can be held in place within reaction chamber 4 in, for example, a vertical position by a suitable holder 20. Substrate 6 is then heated to a temperature sufficient to decompose and vaporize the precursor complex. A vacuum (not shown), which can be created by any suitable vacuum pump, can be provided at opposite end 12 of reaction chamber 4 to create a vacuum within reaction chamber 4. Precursor vapor 8 is introduced into reservoir 10 located at one end of reactor 2 and exposed to a vacuum by opening valve 14 located between reaction chamber 4 and reservoir 10. It should be understood that the precursor complex can be vaporized in reservoir 10 or introduced into reservoir 10 as a pre-vaporized precursor. Precursor vapor 8 then passes into reaction chamber 4 containing one or more units of substrate 6. Reaction chamber 4 is maintained at a preselected temperature, by means of a furnace 16, which is effective to decompose precursor vapor 8 so as to deposit a film 18 containing Ru on the exposed surfaces of substrate 6.

Generally, a thermal reactor CVD system can be used to heat the substrate to a temperature in excess of the decomposition temperature of the selected Ru precursor. Thermal CVD may be effected within any type of apparatus in which the substrate and/or the precursor is heated. By heating the substrate at a sufficiently high temperature, the decomposition reaction occurs at the surface of this substrate. Likewise, in an energy-beam induced CVD technique, an energy source (i.e., ion beam) is advantageously used to heat the substrate such that the decomposition of the precursor occurs predominantly at the substrate surface.

Use of these thermal CVD processes can provide blanket deposition of Ru on substrates. Additionally, selected area depositions of Ru may be accomplished by using a masking material (e.g., resist material) in conjunction with the thermal CVD process or by utilizing a more selective thermal CVD process, such as an energy-beam assisted CVD to selectively heat specific portions of the substrate upon which deposition or "writing" of Ru will be performed.

Many of the processes used for CVD of Ru utilize low pressure systems. However, no criticality with respect to the pressure in the system exists. While typical operating pressures range from about 1 to about 100 mtorr, higher or lower pressures are also acceptable. These variations in pressure are largely determined by a number of factors, such as the vapor pressure of the Ru precursor compound, the speed and efficiency of the vacuum equipment, and physical characteristics of inert carrier gases that can be added to adjust the total pressure.

Additional methods of forming a ruthenium metal film on a semiconductor device using a CVD technique and one or more liquid ruthenium complexes are described in Applicant's Assignee's copending patent application entitled "Methods For Preparing Ruthenium Metal Films" having U.S. Application Ser. No. 09/140,878 Aug. 27, 1998 (Micron Docket No. 97-0994), filed concurrently herewith, the contents of which are incorporated by reference.

The growth of a pure Ru film can be conducted by utilizing any of the aforementioned CVD methods and apparatus designs, using as a precursor a compound of formula 1, 2, or 3, under conditions wherein reactive carrier gases are absent. Alternatively, $RuO_2$ films can be formed by contacting any of the Ru precursors with a heated substrate in the presence of an oxidizing agent. The oxidizing agent may be any gaseous reactant which is capable of reacting with the Ru precursor compounds at the decomposition temperatures of the latter to form Ru oxide deposits. Suitable oxidizing agents for use with the present method include, but are not limited to, air, oxygen, and oxygen-containing compounds, such as nitrous oxide, tetrahydrofuran, and carbon dioxide, and are preferably selected from mildly oxidizing gaseous oxygen sources.

Oxidizing agents may also be introduced into the reactor in combination with a carrier gas. The present method produces conductive $RuO_2$ films on substrates, such as silicon, when the depositions are carried out in atmospheres containing the aforementioned oxidizing agents. X-ray photoelectron spectroscopy (XPS) reveals the deposition of a pure $RuO_2$ film, from $(C_6H_8)Ru(CO)_3$, having a constant oxygen concentration throughout the depth of the deposited film.

In another alternative embodiment, $RuO_2$ films can be made in situ by depositing Ru metal on a substrate, such as a polySi electrode, and subjecting the Ru-containing substrate to post-deposition rapid thermal oxidation ("RTO"). Along with the oxidation of an exposed portion of the Ru layer, the RTO process can cause diffusion between (e.g., silicidation from the polySi electrode) the Ru layer and the substrate or underlying layer (bottom layer) in contact with the Ru layer. However, since Ru silicide is conductive, such a process remains a viable alternative for the manufacture of many semiconductor devices.

The instant process can be modified by depositing the Ru metal first, forming the oxide in situ by oxidizing the Ru metal through any of the oxidizing processes described herein, and siliciding the bottom layer of Ru metal. Alternatively, the Ru layer can be oxidized by post deposition anneal.

Additional methods of forming a $RuO_2$ film on a semiconductor device using a CVD technique and one or more liquid ruthenium complexes are described in Applicant's Assignee's copending patent application entitled "Methods For Preparing Ruthenium Metal Films" having U.S. Application Ser. No. 09/140,932 Aug. 27, 1998 (Micron Docket No. 97-1017), filed concurrently herewith, the contents of which are incorporated by reference.

Various other modifications to the process of the instant invention are envisioned. For example, other metals, alloys, and mixtures thereof can also be deposited, together with Ru or $RuO_2$, onto a substrate. This can be accomplished by contacting one or more precursors of formula 1, 2, or 3 and one or more additional heat-decomposable precursor compounds to yield the desired Ru-containing metallic film. Where non-oxidized Ru metal-containing films are desirable, the deposition is carried out under nonoxidizing conditions. For example, Ru might be alloyed with platinum. Such alloying may be useful to give properties of the film that limit oxidation or provide a better barrier layer in some cases.

The processes described herein result in high quality Ru and $RuO_2$ films which can be deposited at various thicknesses. The thickness of the deposited layer can be modified by controlling a number of variables, such as the time and temperature of deposition, the flow rate of the vapor of the Ru precursor, the length of contact time between the substrate and the Ru precursor compounds, and the volatility of the specific Ru precursor selected. Products and structures manufactured according to the process of this invention can be made to have any desired Ru-containing layer thickness. A preferred range of thickness for semiconductor or electronic applications is from a monomolecular layer to about 0.1 microns.

The processes described herein are useful to deposit Ru and $RuO_2$ onto a substrate, such as a semiconductor substrate, to create diffusion barriers, electrode materials, semiconductor dopants, contact metallizations, interconnection traces, and the like. Any of the processes described herein advantageously provide low-temperature deposition of Ru and $RuO_2$-containing layers having conformal coverage and excellent step coverage.

The present invention will be understood more fully from the description which follows, and from the accompanying examples, in which particular embodiments of the process of the invention are shown. It is to be understood at the outset, however, that persons of skill in the appropriate arts may modify the invention herein described while still achieving the favorable results of this invention. Accordingly, the description and examples which follow are to be understood as being a broad teaching disclosure directed to persons of skill in the appropriate arts, and are not to be understood as limiting upon the present invention. The scope of the invention is to be determined by the appended claims.

EXAMPLE I

Preparation of $(C_6H_8)Ru(CO)_3$ $(C_6H_8)Ru(CO)_3$ was prepared by mixing 1.0 gm of $Ru_3(CO)_{12}$ (Strem Chemicals, Inc., Newburyport, Mass.), 30 mls of benzene (Aldrich Chemical Co., Milwaukee, Wis.), and 0.45 ml of 1,3-cyclohexadiene (3 equivalents, 4.69 mmol) (Aldrich Chemical Co., Milwaukee, Wis.) in a glass flask. The resulting solution was heated to 80° C. and refluxed for 2 hours, at which point the solution turned red in color. Refluxing was continued while maintaining the temperature constant for approximately 3 more hours to ensure no further chemical change, as evidenced by a lack of color change in the solution. An excess (2.5 mls) of 1,3-cyclohexadiene was then added to the solution and the resulting solution was refluxed for approximately 48 hours. After the initial 8 hour period of refluxing, the solution turned orange in color, progressing to a yellow coloration toward the end of the 48 hour refluxing period. Refluxing was halted and the solution was stirred for approximately 66 hours.

The flask was then isolated, attached to a vacuum line, and the bulk of the benzene was removed from the flask. The remaining portion of the solution was cannula transferred to a mini-distillation apparatus, where a pressure in manifold of about 6 Torr was established. Remaining amounts of benzene and 1,3-cyclohexadiene were removed by warming the contents of the flask by heating mantle to about 40° C. The flask was then heated to about 60° C. under static vacuum and the receiver was cooled in order to remove the product of the reaction, a colorless oil of $(C_6H_8)Ru(CO)_3$.

Spectroscopic data for $(C_6H_8)Ru(CO)_3$ was as follows: IR $V_{CO}$ 2058(vs), 1978(vs, br); $^1H$ NMR $\delta 4.81$ (m, 2H), $\delta 2.84$ (m, 2H), $\delta 1.42$ (m, 4H); $^{13}C\{^1H\}$ NMR $\delta 199.0$ (CO), $\delta 87.2$, $\delta 55.7$, $\delta 25.0$.

EXAMPLE II

Ruthenium film deposition from $(C_6H_8)Ru(CO)_3$

The precursor $(C_6H_8)Ru(CO)_3$, prepared according to the description of Example I, was added to a glass bubbler equipped with a dip tube and an exit valve. The bubbler was added to a cold-walled research CVD reactor and a He carrier gas was plumbed into the bubbler. A wafer of p-type silicon was placed in the reactor and heated to 300° C. (as measured by a thermocouple in direct contact with the surface of the wafer). Concurrently with the heating of the wafer, the chamber pressure was stabilized at 3.0 Torr with 25 sccm of He and 50 sccm of $N_2$ being individually flowed through a bubbler bypass line and into the reactor. Additional He carrier gas was then diverted through the bubbler for approximately 1 minute, the chamber was evacuated, and the wafer was cooled to room temperature.

A smooth, highly reflective coating of metallic Ru was formed on the wafer. X-ray photoelectron spectroscopy (XPS) was used to profile the film deposited on the wafer. XPS revealed a pure Ru film having a thickness of approximately 400 Å. X-ray diffraction (XRD) was also carried out on a deposited Ru film sample, which revealed that the deposited sample film was polycrystalline Ru.

EXAMPLE III

Ruthenium oxide film deposition from $(C_6H_8)Ru(CO)_3$

Deposition of $RuO_2$ was carried out using a similar method to that described in Example II, except that the wafer surface was heated to 200° C. and the $N_2$ was replaced by $O_2$ at 50 sccm. A one minute deposition was then carried out and the wafer was allowed to cool to room temperature.

A smooth, highly reflective coating of metallic $RuO_2$ was formed on the wafer. X-ray photoelectron spectroscopy (XPS) was used to profile the film deposited on the wafer. XPS revealed a pure $RuO_2$ film having a thickness of approximately 400 Å. X-ray diffraction (XRD) was also carried out on a deposited $RuO_2$ film sample, which revealed that the deposited film sample was polycrystalline $RuO_2$.

EXAMPLE IV

Preparation of $(C_7H_{10})Ru(CO)_3$

The precursor $(C_7H_{10})Ru(CO)_3$ was prepared according to the method of Example I, except that 1,3-cycloheptadiene was used instead of cyclohexadiene. A colorless oil of $(C_7H_{10})Ru(CO)_3$ was produced.

Spectroscopic data for $(C_7H_{10})Ru(CO)_3$ was as follows: IR $V_{CO}$ 2056 (vs), 1975 (vs, br); $^1H$ NMR δ4.79 (m, 2H), δ2.74 (m, 2H), δ1.61 (m, 4H), δ1.14 (m, 2H); $^{13}C\{^1H\}$ NMR δ197.2 (CO), δ90.3, δ52.9, δ27.9, δ27.2.

What is claimed is:

1. A method of applying a film of a ruthenium containing material on a surface of a substrate comprising employing a chemical vapor deposition technique to decompose a precursor compound of the formula $L_yRuX_z$, where
   (a) L is a neutral or monoanionic ligand selected from the group consisting of linear hydrocarbyls, branched hydrocarbyls, cyclic hydrocarbyls, cyclic alkenes, dienes, cyclic dienes, trienes, cyclic trienes, bicyclic alkenes, bicyclic dienes, bicyclic trienes, tricyclic alkenes, tricyclic dienes, tricyclic trienes, fluorinated derivatives thereof, combinations thereof, and derivatives thereof additionally containing heteroatoms selected from the group consisting of halides, Si, S, Se, P, As, N and O;
   (b) y has a value of from one (1) to three (3);
   (c) X is a pi-bonding ligand selected from the group consisting of CO, NO, CN, CS, nitrites, isonitriles, trialkylphosphine, trialkylamine, isocyanide, and combinations thereof; and
   (d) z has a value of from one (1) to three (3).

2. The method of claim 1, wherein the precursor compound is a liquid.

3. The method of claim 1, wherein the substrate is a semiconductor wafer.

4. The method of claim 1, wherein the chemical vapor deposition technique is a hot wall chemical vapor deposition.

5. The method of claim 1, wherein the chemical vapor deposition technique is a cold wall chemical vapor deposition.

6. The method of claim 1, wherein the chemical vapor deposition technique is an atmospheric chemical vapor deposition.

7. The method of claim 1, wherein the chemical vapor deposition technique is a low-pressure chemical vapor deposition.

8. The method of claim 1, wherein the precursor compound is cyclohexadienetricarbonyl ruthenium.

9. The method of claim 1, wherein the precursor compound is cycloheptadienetricarbonyl ruthenium.

10. The method of claim 1, wherein the precursor compound contains oxygen.

11. The method of claim 1, wherein the chemical vapor deposition technique is carried out in the presence of an oxidizing gas to deposit films of $RuO_2$.

12. The method of claim 11, wherein said oxidizing gas comprises oxygen.

13. The method of claim 11, wherein said oxidizing gas comprises an oxygen-containing compound.

14. The method of claim 1, wherein said ruthenium containing material comprises pure ruthenium.

15. The method of claim 1, wherein said ruthenium containing material comprises a ruthenium oxide.

16. A method of applying a film of a ruthenium containing material on a surface of a substrate comprising employing a chemical vapor deposition technique to decompose a precursor compound of the formula $L_1RuX_3$ where
   (a) L is a neutral or monoanionic ligand selected from the group consisting of linear hydrocarbyls, branched hydrocarbyls, cyclic hydrocarbyls, cyclic alkenes, dienes, cyclic dienes, trienes, cyclic trienes, bicyclic alkenes, bicyclic dienes, bicyclic trienes, tricyclic alkenes, tricyclic dienes, tricyclic trienes, fluorinated derivatives thereof, combinations thereof, and derivatives thereof additionally containing heteroatoms selected from the group consisting of halides, Si, S, Se, P, As, N and O; and
   (b) X is a pi-bonding ligand selected from the group consisting of CO, NO, CN, CS, nitrites, isonitriles, trialkylphosphine, trialkylamine, isocyanide, and combinations thereof.

17. The method of claim 16, wherein the precursor compound is a liquid.

18. The method of claim 16, wherein the substrate is a semiconductor wafer.

19. The method of claim 16, wherein the chemical vapor deposition technique is a hot wall chemical vapor deposition.

20. The method of claim 16, wherein the chemical vapor deposition technique is a cold wall chemical vapor deposition.

21. The method of claim 16, wherein the chemical vapor deposition technique is an atmospheric chemical vapor deposition.

22. The method of claim 16, wherein the chemical vapor deposition technique is a low-pressure chemical vapor deposition.

23. The method of claim 16, wherein the precursor compound contains oxygen.

24. The method of claim 16, wherein the chemical vapor deposition technique is carried out in the presence of an oxidizing gas to deposit films of $RuO_2$.

25. The method of claim 24, wherein said oxidizing gas comprises oxygen.

26. The method of claim 24, wherein said oxidizing gas comprises an oxygen-containing compound.

27. The method of claim 16, wherein said ruthenium containing material comprises pure ruthenium.

28. The method of claim 16, wherein said ruthenium containing material comprises a ruthenium oxide.

29. A method of applying a film of a ruthenium containing material on a surface of a substrate comprising employing a chemical vapor deposition technique to decompose a precursor compound of the formula $L_1Ru(CO)_4$ where L is a neutral or monoanionic ligand selected from the group consisting of linear hydrocarbyls, branched hydrocarbyls, cyclic hydrocarbyls, cyclic alkenes, dienes, cyclic dienes, trienes, cyclic trienes, bicyclic dienes, and bicyclic trienes.

30. The method of claim 29, wherein the precursor compound is a liquid.

31. The method of claim 29, wherein the substrate is a semiconductor wafer.

32. The method of claim 29, wherein the chemical vapor deposition technique is a hot wall chemical vapor deposition.

33. The method of claim 29, wherein the chemical vapor deposition technique is a cold wall chemical vapor deposition.

34. The method of claim 29, wherein the chemical vapor deposition technique is an atmospheric chemical vapor deposition.

35. The method of claim 29, wherein the chemical vapor deposition technique is a low-pressure chemical vapor deposition.

36. The method of claim 29, wherein the precursor compound contains oxygen.

37. The method of claim 29, wherein the chemical vapor deposition technique is carried out in the presence of an oxidizing gas to deposit films of $RuO_2$.

38. The method of claim 37, wherein said oxidizing gas comprises oxygen.

39. The method of claim 37, wherein said oxidizing gas comprises an oxygen-containing compound.

40. The method of claim 29, wherein said ruthenium containing material comprises pure ruthenium.

41. The method of claim 29, wherein said ruthenium containing material comprises a ruthenium oxide.

42. A method for depositing a ruthenium containing material on a substrate comprising:
providing a precursor compound of the formula $L_yRuX_z$, where
L is a neutral or monoanionic ligand selected from the group consisting of linear hydrocarbyls, branched hydrocarbyls, cyclic hydrocarbyls, cyclic alkenes, dienes, cyclic dienes, trienes, cyclic trienes, bicyclic alkenes, bicyclic dienes, bicyclic trienes, tricyclic alkenes, tricyclic dienes, tricyclic trienes, fluorinated derivatives thereof, combinations thereof, and derivatives thereof additionally containing heteroatoms selected from the group consisting of halides, Si, S, Se, P, As, N and O;
y has a value of from one (1) to three (3);
X is a pi-bonding ligand selected from the group consisting of CO, NO, CN, CS, nitrites, isonitriles, trialkylphosphine, trialkylamine, isocyanide, and combinations thereof; and
z has a value of from one (1) to three (3);
placing the substrate in a reaction chamber;
heating said substrate to a temperature at least equal to the decomposition temperature of said precursor compound; and
transporting said precursor compound into said reaction chamber to permit said precursor to decompose onto said substrate and deposit a film containing Ru thereon.

43. The method of claim 42, wherein said reaction chamber is maintained at an atmospheric pressure.

44. The method of claim 42, wherein said reaction chamber is maintained at a subatmospheric pressure.

45. The method of claim 42, further including heating said reaction chamber after the substrate is placed into said reaction chamber.

46. The method of claim 42, wherein said precursor compound contains oxygen.

47. The method of claim 42, further comprising introducing an oxidizing gas into said reaction chamber after said substrate is heated.

48. The method of claim 47, wherein said oxidizing gas comprises oxygen.

49. The method of claim 47, wherein said oxidizing gas comprises an oxygen-containing compound.

50. The method of claim 42, wherein said ruthenium containing material comprises pure ruthenium.

51. The method of claim 42, wherein said ruthenium containing material comprises a ruthenium oxide.

52. A method for depositing a ruthenium containing material on a substrate comprising:
providing a precursor compound of the formula $L_1RuX_3$ where
L is a neutral or monoanionic ligand selected from the group consisting of linear hydrocarbyls, branched hydrocarbyls, cyclic hydrocarbyls, cyclic alkenes, dienes, cyclic dienes, trienes, cyclic trienes, bicyclic alkenes, bicyclic dienes, bicyclic trienes, tricyclic alkenes, tricyclic dienes, tricyclic trienes, fluorinated derivatives thereof, combinations thereof, and derivatives thereof additionally containing heteroatoms selected from the group consisting of halides, Si, S, Se, P, As, N and O;
X is a pi-bonding ligand selected from the group consisting of CO, NO, CN, CS, nitrites, isonitriles, trialkylphosphine, trialkylamine, isocyanide, and combinations thereof;
placing the substrate in a reaction chamber;
heating said substrate to a temperature at least equal to the decomposition temperature of said precursor compound; and
transporting said precursor compound into said reaction chamber to permit said precursor to decompose onto said substrate and deposit a film containing Ru thereon.

53. The method of claim 52, wherein said reaction chamber is maintained at an atmospheric pressure.

54. The method of claim 52, wherein said reaction chamber is maintained at a subatmospheric pressure.

55. The method of claim 52, further including heating said reaction chamber after the substrate is placed into said reaction chamber.

56. The method of claim 52, wherein said precursor compound contains oxygen.

57. The method of claim 52, further comprising introducing an oxidizing carrier gas into said reaction chamber after said substrate is heated.

58. The method of claim 57, wherein said oxidizing gas comprises oxygen.

59. The method of claim 57, wherein said oxidizing gas comprises an oxygen-containing compound.

60. The method of claim 52, wherein said ruthenium containing material comprises pure ruthenium.

61. The method of claim 52, wherein said ruthenium containing material comprises a ruthenium oxide.

62. A method for depositing a ruthenium containing material on a substrate comprising:

providing a precursor compound of the formula $L_1Ru(CO)_4$ where L is a neutral or monoanionic ligand selected from the group consisting of linear hydrocarbyls, branched hydrocarbyls, cyclic hydrocarbyls, cyclic alkenes, dienes, cyclic dienes, trienes, cyclic trienes, bicyclic dienes, and bicyclic trienes;

placing the substrate in a reaction chamber;

heating said substrate to a temperature at least equal to the decomposition temperature of said precursor compound; and transporting said precursor compound into said reaction chamber to permit said precursor to decompose onto said substrate and deposit a film containing Ru thereon.

63. The method of claim 62, wherein said reaction chamber is maintained at an atmospheric pressure.

64. The method of claim 62, wherein said reaction chamber is maintained at a subatmospheric pressure.

65. The method of claim 62, further including heating said reaction chamber after the substrate is placed into said reaction chamber.

66. The method of claim 62, wherein said precursor compound contains oxygen.

67. The method of claim 62, further comprising introducing an oxidizing gas into said reaction chamber after said substrate is heated.

68. The method of claim 67, wherein said oxidizing gas comprises oxygen.

69. The method of claim 67, wherein said oxidizing gas comprises an oxygen-containing compound.

70. The method of claim 62, wherein said ruthenium containing material comprises pure ruthenium.

71. The method of claim 62, wherein said ruthenium containing material comprises a ruthenium oxide.

* * * * *

UNITED STATES PATENT AND TRADEMARK OFFICE
CERTIFICATE OF CORRECTION

PATENT NO. : 6,603,705  
DATED : May 16, 2000  
INVENTOR(S) : Brian A. Vaartstra It is certified that error appears in the above-identified patent and that said Letters Patent is hereby corrected as shown below:

<u>Title page,</u>  
Item [56], References Cited, U.S. PATENT DOCUMENTS, before "7/1992" insert -- * --; before "5/1994" insert -- * --; and before "10/1994" insert -- * --  
OTHER PUBLICATIONS, after "1985." insert -- * --; and after "1969." insert -- * --

<u>Column 5,</u>  
Line 61, change "precursor." to -- precursor, can be used --

<u>Column 13,</u>  
Line 2, delete "carrier"

Signed and Sealed this

Eighteenth Day of November, 2003

JAMES E. ROGAN  
*Director of the United States Patent and Trademark Office*

UNITED STATES PATENT AND TRADEMARK OFFICE
CERTIFICATE OF CORRECTION

PATENT NO. : 6,063,705
DATED : May 16, 2000
INVENTOR(S) : Brian A. Vaartstra

It is certified that error appears in the above-identified patent and that said Letters Patent is hereby corrected as shown below:

Title page,
Item [56], References Cited, U.S. PATENT DOCUMENTS, before "7/1992" insert -- * --; before "5/1994" insert -- * --; and before "10/1994" insert -- * --
OTHER PUBLICATIONS, after "1985." insert -- * --; and after "1969." insert -- * --

Column 5,
Line 61, change "precursor." to -- precursor, can be used --

Column 13,
Line 2, delete "carrier"

Signed and Sealed this

Second Day of December, 2003

JAMES E. ROGAN
*Director of the United States Patent and Trademark Office*